US008618970B2

(12) United States Patent
Sato et al.

(10) Patent No.: US 8,618,970 B2
(45) Date of Patent: Dec. 31, 2013

(54) DA CONVERSION DEVICE AND ELECTRON BEAM EXPOSURE SYSTEM USING THE SAME

(71) Applicants: Advantest Corporation, Tokyo (JP); Hitachi Information & Communication Engineering, Ltd., Yokohama (JP)

(72) Inventors: Takamasa Sato, Tokyo (JP); Ryozo Yoshino, Yokohama (JP); Atsushi Higashino, Yokohama (JP)

(73) Assignees: Advantest Corp., Tokyo (JP); Hitachi Information & Teleommunication Engineering, Ltd., Kanagawa (JP)

( * ) Notice: Subject to any disclaimer, the term of this patent is extended or adjusted under 35 U.S.C. 154(b) by 0 days.

(21) Appl. No.: 13/682,311

(22) Filed: Nov. 20, 2012

(65) Prior Publication Data
US 2013/0270449 A1    Oct. 17, 2013

(30) Foreign Application Priority Data
Apr. 13, 2012  (JP) ................................. 2012-091762

(51) Int. Cl.
*H03M 1/66* (2006.01)
*H03K 19/0175* (2006.01)

(52) U.S. Cl.
USPC ............................... 341/144; 326/82; 326/86

(58) Field of Classification Search
CPC .................................. H03M 1/66; H03M 1/70
USPC .................................. 341/144, 145
See application file for complete search history.

(56) References Cited

U.S. PATENT DOCUMENTS

| 4,644,253 | A  | * | 2/1987 | Libert ........................... 323/275 |
| 4,692,579 | A  | * | 9/1987 | Saitou et al. ................ 250/492.2 |
| 7,482,829 | B2 | * | 1/2009 | Hirata et al. ............. 324/762.01 |
| 2006/0125676 | A1 | * | 6/2006 | Kobayashi ..................... 341/155 |
| 2007/0115159 | A1 | * | 5/2007 | Tachibana et al. ............ 341/144 |
| 2007/0252571 | A1 | * | 11/2007 | Hirata et al. .................. 323/304 |

(Continued)

FOREIGN PATENT DOCUMENTS

| JP | 58-029220 | | 2/1983 |
| JP | 61214342 A | * | 9/1986 |

(Continued)

OTHER PUBLICATIONS

Inventor: Inoue Shinichi Applicant: Sony Corp Title: Electronic Device Date of filing: Oct. 8, 1992 Publication No. 06-061853 Date of publication of application: Apr. 3, 1994.*

(Continued)

*Primary Examiner* — Thienvu Tran
(74) *Attorney, Agent, or Firm* — Muramatsu & Associates

(57) ABSTRACT

A DA conversion device includes a current output type DA converter, a high-speed operational amplifier operating at a low voltage and configured to generate a voltage corresponding to an output current from the DA converter, and a buffer amplifier connected to an output terminal of the high-speed operational amplifier and operating at a high voltage. The device also includes positive and negative floating power supplies separated from a power supply system and provided as power supplies for driving the DA converter and the high-speed operational amplifier. A midpoint between potentials at the floating power supplies is connected to an output terminal of the buffer amplifier to cause the DA converter and the high-speed operational amplifier to operate mainly based on an output voltage from the buffer amplifier.

6 Claims, 5 Drawing Sheets

(56) References Cited

U.S. PATENT DOCUMENTS

| | | |
|---|---|---|
| 2008/0246642 A1* | 10/2008 | Min .............................. 341/144 |
| 2010/0314560 A1* | 12/2010 | Yabara ....................... 250/492.3 |
| 2011/0012617 A1* | 1/2011 | Goshima et al. .............. 324/555 |
| 2012/0256106 A1* | 10/2012 | Kurokawa et al. ....... 250/492.22 |

FOREIGN PATENT DOCUMENTS

| | | |
|---|---|---|
| JP | 06-061853 | 3/1994 |
| JP | 07-325112 | 12/1995 |
| JP | 10-289841 | 10/1998 |
| JP | H1-074789 | 3/1999 |
| JP | 2000099168 A * | 4/2000 |
| JP | 2008-070307 | 3/2008 |
| JP | 2010-193259 | 9/2010 |
| JP | 2010193259 A * | 9/2010 |
| WO | WO 2007/125680 | 11/2007 |

OTHER PUBLICATIONS

Inventor: Inoue Shinichi Applicant: Sony Corp Title: Electronic Device Date of filing: Oct. 8, 1992 Publication No. 06-061853 Date of publication of application: Apr. 3, 1994 Machine English Translation.*

Office action issued by Japanese Patent Office for counterpart Japanese application and its English translation.

* cited by examiner

80

DA CONVERSION DEVICE AND ELECTRON BEAM EXPOSURE SYSTEM USING THE SAME

CROSS-REFERENCE TO RELATED APPLICATIONS

This application is based upon and claims and the benefit of priority of the prior Japanese Patent Application No. 2012-091762, filed Apr. 13, 2012, the entire contents of which are incorporated herein by reference.

TECHNICAL FIELD

The embodiments discussed herein are related to a digital-to-analog (DA) conversion device and an electron beam exposure system using the same.

BACKGROUND ART

A DA conversion device requiring high-speed performance includes a current output type DA converter which can be easily increased in speed. The device converts an output current from the DA converter into a voltage with a current-voltage conversion circuit formed of an operational amplifier, and then outputs the voltage thus obtained.

In the meantime, an electron beam deflection circuit in an electron beam exposure system and the like, or a control circuit in a MRI (magnetic resonance imaging) apparatus and the like may sometimes require a relatively high output voltage ranging from several tens of volts to several hundreds of volts, for example.

In a DA conversion device used for such applications, a current-voltage conversion circuit adopts an operational amplifier which is operable at a high voltage.

However, commercially available high-voltage operational amplifiers have a low operating speed and may cause restriction in operating speed of such a DA conversion device.

Patent Literature 1

Japanese Laid-open Patent Publication No. 2010-193259

SUMMARY OF INVENTION

Technical Problem

In view of the above, it is an object of the present invention to provide a DA conversion device which is capable of outputting a high voltage and is excellent in terms of an operating speed.

Solution to Problem

A first aspect of the invention provides a DA conversion device including: a current output type DA converter; an operational amplifier including a non-inverting input terminal connected to the DA converter and an inverting input terminal connected to an external output unit to output an output signal to outside, and being configured to generate a voltage at the external output unit, the voltage corresponding to an output current from the DA converter; a buffer amplifier connected to an output terminal of the operational amplifier; and floating power supplies configured to respectively supply positive and negative power supply voltages to the DA converter and the operational amplifier, a midpoint between the positive and negative power supplies being connected to an output terminal of the buffer amplifier.

Meanwhile, another aspect of the invention provides an electron beam exposure system including: an electron gun configured to emit an electron beam; an electrostatic deflector configured to deflect the electron beam; and a control section configured to control a voltage to be applied to the electrostatic deflector. In the system, the control section includes a DA conversion device having: a current output type DA converter; an operational amplifier having a non-inverting input terminal connected to the DA converter and an inverting input terminal connected to an external output unit to output an output signal to outside, and being configured to generate a voltage at the external output unit, the voltage corresponding to an output current from the DA converter; a buffer amplifier connected to an output terminal of the operational amplifier; and floating power supplies configured to respectively supply positive and negative power supply voltages to the DA converter and the operational amplifier, and a midpoint voltage midpoint between the positive and negative power supplies is connected to an output terminal of the buffer amplifier.

Advantageous Effects of Invention

According to the DA conversion device of the above-described aspect, the DA converter and the operational amplifier configured to convert an output current from the DA converter into a voltage are driven by the floating power supplies each having the potential which varies with the output voltage from the buffer amplifier.

As a consequence, the operational amplifier operates normally even if the output voltage from the buffer amplifier greatly exceeds a withstand voltage of the operational amplifier. Thus, the output voltage from the external output unit can be controlled by using the operational amplifier having a low withstand voltage and an excellent operating speed.

Accordingly, it is possible to obtain a DA conversion device which enables reduction in settling time for stabilization of an output voltage, is capable of outputting a high voltage, and is excellent in terms of an operating speed.

Meanwhile, by applying the DA conversion device of the above-described aspect to the control circuit for the electrostatic deflector, a scanning speed of the electron beam is increased whereby productivity of the electron beam exposure system is improved.

DESCRIPTION OF EMBODIMENTS

A prelude will be explained before description of embodiments.

Figure 1:
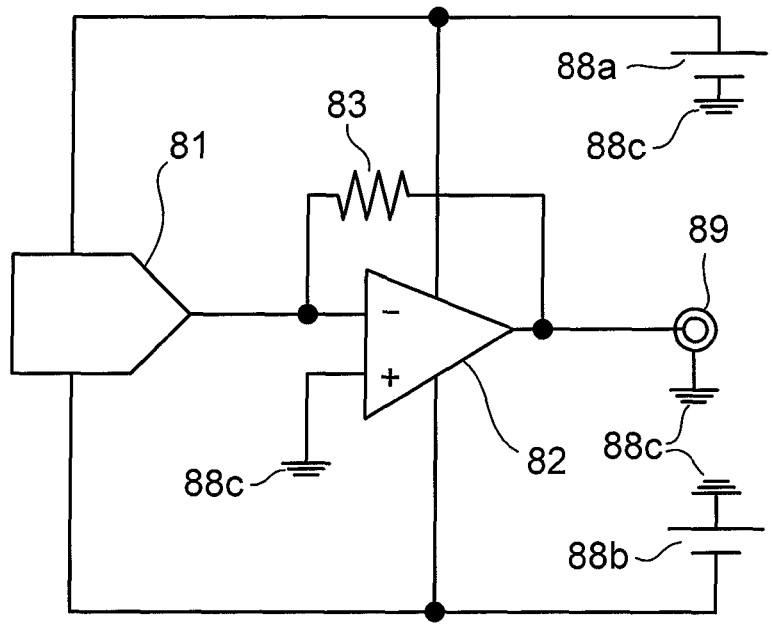
FIG. 1 is a circuit diagram of a DA conversion device according to a prelude.

FIG. 1 is a circuit diagram of a DA conversion device 80 according to the prelude.

The DA conversion device 80 includes a current output type DA converter 81. An output terminal of the DA converter 81 is connected to an inverting input terminal of an operational amplifier 82. The inverting input terminal of the operational amplifier 82 is connected to an output terminal of the operational amplifier 82 via a resistor 83 and these constituents collectively form a closed feedback loop (a closed loop). Meanwhile, a non-inverting input terminal of the operational amplifier 82 is connected to a grounding conductor 88c.

A first power supply 88a and a second power supply 88b are connected to the operational amplifier 82 and the DA converter 81. The first power supply 88a generates a positive voltage V on the basis of potential of the grounding conductor 88c while the second power supply 88b generates a negative voltage −V on the basis of the potential of the grounding conductor 88c.

In the DA conversion device 80, an output current from the DA converter 81 flows into the output terminal of the operational amplifier 82 via the resistor 83.

The operational amplifier 82 operates under a closed-loop condition and therefore controls a voltage at the output terminal in such a manner that the voltage at the inverting input terminal becomes equal to the voltage at the non-inverting input terminal. For this reason, a voltage corresponding to a product of the output current from the DA converter 81 and a resistance value of the resistor 83 is outputted from the output terminal of the operational amplifier 82.

In this way, the output current from the DA converter 81 is converted into the voltage by the operational amplifier 82.

In the meantime, when the DA conversion device 80 is used as a drive circuit for an electrostatic deflector in an electron beam exposure system or the like, the DA conversion device 80 is required to output a high voltage of ±40 V or ±250 V, for example. In this case, a high-voltage operational amplifier needs to be used as the operational amplifier 82.

However, commercially available high-voltage operational amplifiers have shortcomings of low operating speeds.

For instance, a commercially available operational amplifier with a withstand voltage of about ±6 V has a gain bandwidth of about 500 MHz whereas an operational amplifier with a withstand voltage of about ±40 V merely has a gain bandwidth of about 100 MHz. Thus, the high-voltage amplifier has a low operating speed.

As a consequence, the DA conversion device 80 using the operational amplifier which operates at a high voltage causes a voltage fluctuation such as voltage overshoot or ringing after a change in the output voltage. A long settling time is required for settling such a voltage fluctuation, and it is therefore difficult to operate the DA conversion device 80 at a high speed.

Now, examples of the invention will be described.

Example 1

Figure 2:
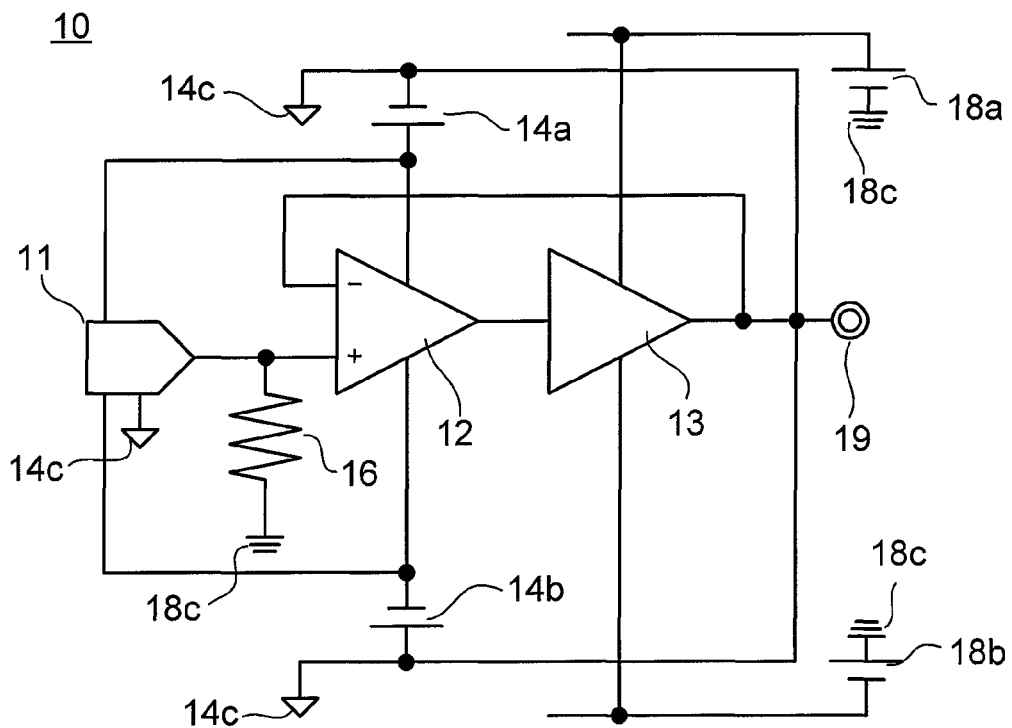
FIG. 2 is a circuit diagram of a DA conversion device according to Example 1.

FIG. 2 is a circuit diagram of a DA conversion device according to Example 1.

As shown in FIG. 2, a DA conversion device 10 of this example includes the following active elements, namely, a DA converter 11, a high-speed operational amplifier 12, and a buffer amplifier 13.

The DA converter 11 is a current output type DA converter and its output terminal is connected to a non-inverting input terminal of the high-speed operational amplifier 12.

The high-speed operational amplifier 12 is an operational amplifier which has a relatively low withstand voltage of several volts but operates at a high speed equivalent to a gain bandwidth of at least several hundreds of megahertz. For example, a commercially available operational amplifier having a withstand voltage of about ±5V and a gain bandwidth of about 600 MHz can be used as the high-speed operational amplifier 12.

An output terminal of the high-speed operational amplifier 12 is connected to the buffer amplifier 13 while an inverting input terminal of the high-speed operational amplifier 12 is connected to an output terminal of the buffer amplifier 13. Thus, a closed loop is formed. Meanwhile, a resistor 16 is connected between the non-inverting input terminal of the high-speed operational amplifier 12 and a grounding conductor 18c.

The output terminal of the buffer amplifier 13 is connected to an external output unit 19 with which the DA conversion device 10 is connected to an external device. The buffer amplifier 13 is a power amplifier circuit which operates at a relatively high power supply voltage ranging from several tens of volts to several hundreds of volts. For example, a push-pull circuit using a pair of a p-type transistor and an n-type transistor, or a high-voltage operational amplifier having a gain set to about 1 can be used as the buffer amplifier 13.

A first power supply 18a and a second power supply 18b are connected to the buffer amplifier 13. The first power supply 18a generates a positive voltage $V_1^+$ relative to the grounding conductor 18c while the second power supply 18b generates a negative voltage $V_1^-$ relative to the grounding conductor 18c. The voltages $V_1^+$ and $V_1^-$ are relatively high voltages such as ±40 V or ±250 V.

The DA conversion device 10 of this example further includes a first floating power supply 14a and a second floating power supply 14b, which are independent from the first power supply 18a and the second power supply 18b.

Batteries can be used as the first floating power supply 14a and the second floating power supply 14b, for example. The first and second floating power supplies 14a and 14b are connected in series while interposing a midpoint 14c in between. The first floating power supply 14a generates a positive voltage $V_2^+$ on the basis of potential at the midpoint 14c while the second floating power supply 14b generates a negative voltage $V_2^-$ on the basis of the potential at the midpoint 14c.

The power from each of the floating power supplies 14a and 14b is supplied to the DA converter 11 and the high-speed operational amplifier 12, whereby the DA converter 11 and the high-speed operational amplifier 12 operate on the basis of the potential at the midpoint 14c.

The voltages of the floating power supplies 14a and 14b are not particularly limited and may be appropriately set according to the withstand voltage of the available operational amplifier. The voltages can be set to about ±5 V, for example.

Moreover, the midpoint 14c in the DA conversion device 10 of this example is connected to the output terminal of the buffer amplifier 13. Accordingly, the potential at the midpoint 14c relative to the grounding conductor 18c varies depending on an output voltage from the buffer amplifier 13.

Accordingly, the DA converter 11 and the high-speed operational amplifier 12 operate mainly based on the potential at the output terminal of the buffer amplifier 13.

Figure 3:
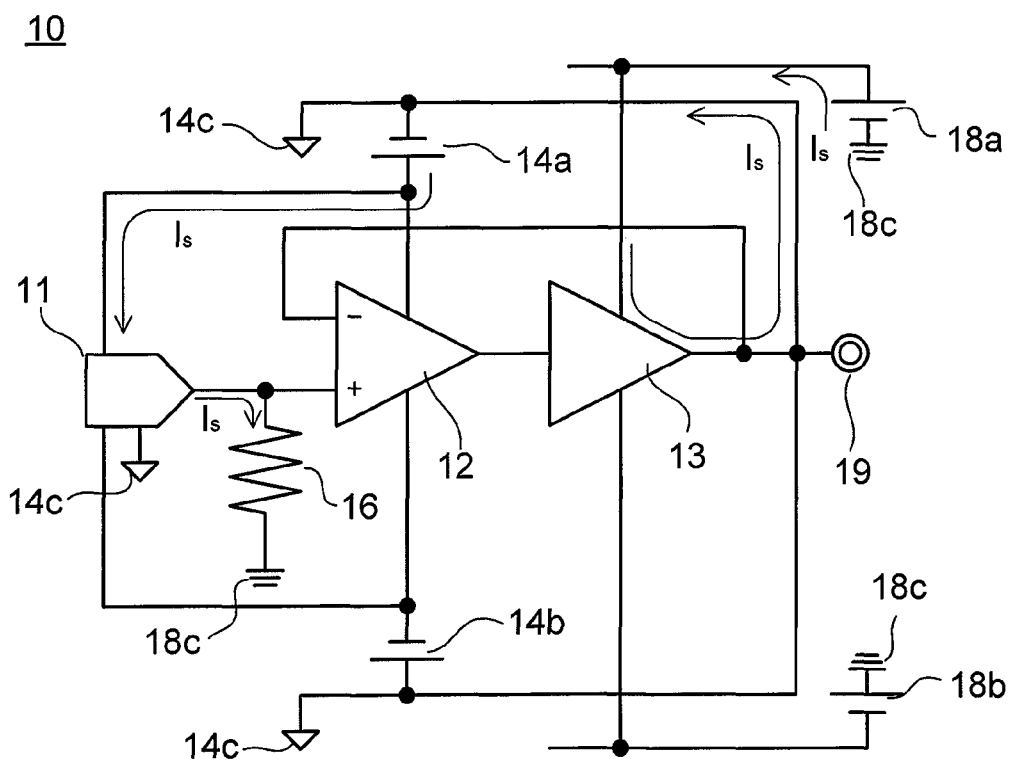
FIG. 3 is a circuit diagram showing an operation of the DA conversion device of FIG. 2.

Now, an operation of the DA conversion device 10 will be described below. FIG. 3 is a circuit diagram showing the operation of the DA conversion device 10.

As shown in FIG. 3, the DA converter 11 outputs a predetermined current $i_s$ on the basis of an inputted digital signal. The outputted current $i_s$ flows into the grounding conductor 18c via the resistor 16. The current $i_s$ further flows to the output terminal of the buffer amplifier 13 via the first power supply 18a and then back to the DA converter 11 via the corresponding midpoint 14c and the first floating power supply 14a.

The current $i_s$ generates a potential difference between the two ends of the resistor 16. As a consequence, the potential at the non-inverting input terminal of the high-speed operational amplifier 12 becomes higher than the potential at the grounding conductor 18c.

Thus, the output from the high-speed operational amplifier 12 is increased whereby the voltage at the output terminal of the buffer amplifier 13 is increased. Since the high-speed operational amplifier 12 operates in the state of the closed loop with the buffer amplifier 13, the output terminal of the buffer amplifier 13 and the non-inverting input terminal of the high-speed operational amplifier 12 have the same voltage. In addition, a voltage equal to a product of the output current $i_s$ from the DA converter 11 and a resistance value of the resistor 16 is outputted from the external output unit 19 of the DA conversion device 10.

During this process, the potential at the midpoint 14c changes according to the potential at the output terminal of the buffer amplifier 13. Thus, the high-speed operational amplifier 12 and the DA converter 11 operate mainly based on the potential at the output terminal of the buffer amplifier 13.

Accordingly, even when the potential at the output terminal of the buffer amplifier 13 greatly exceeds the withstand voltage of the high-speed operational amplifier 12, no voltage in excess of the withstand voltage is applied to the high-speed operational amplifier 12 and therefore the high-speed operational amplifier 12 operates normally.

As a result, voltage overshoot or ringing which may occur in a high-voltage operational amplifier is promptly settled by feedback control of the high-speed operational amplifier 12, whereby settling time for stabilization of the output voltage is remarkably reduced.

Hence, it is possible to obtain the DA conversion device which is capable of outputting a high voltage and is excellent in high-speed performance.

Example 2

Figure 4:
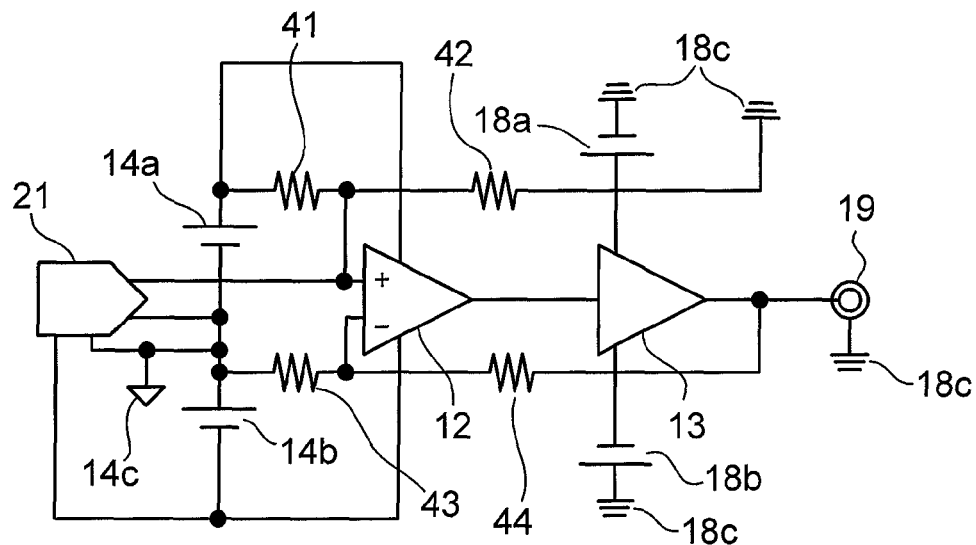
FIG. 4 is a circuit diagram of a DA conversion device according to Example 2.

FIG. 4 is a circuit diagram showing a DA conversion device according to Example 2.

A DA conversion device 20 of this example can obtain positive and negative output voltages even when a direction of an output current from a DA converter is unchangeable.

Now, constituents of the DA conversion device 20 will be described below. Note that the constituents in FIG. 4 which are similar to those in the DA conversion device 10 of FIG. 2 will be denoted by the same reference numerals and detailed description thereof will be omitted.

As shown in FIG. 4, the DA conversion device 20 includes a DA converter 21, the high-speed operational amplifier 12, the buffer amplifier 13, the floating power supplies 14a and 14b, and first to fourth resistors 41, 42, 43, and 44.

The first and second floating power supplies 14a and 14b are connected in series while interposing a midpoint 14c in between. The midpoint 14c is connected to the output terminal of the buffer amplifier 13 via the serially connected third resistor 43 and the fourth resistor 44.

Meanwhile, a positive electrode of the first floating power supply 14a is connected to the grounding conductor 18c via the serially connected first resistor 41 and the second resistor 42.

The DA converter 21 is a differential current output type DA converter. One of output terminals of the DA converter 21 is connected to the non-inverting input terminal of the high-speed operational amplifier 12 while the other output terminal is connected to the midpoint 14c.

The non-inverting input terminal of the high-speed operational amplifier 12 is connected between the first resistor 41 and the second resistor 42 while the inverting input terminal of the high-speed operational amplifier 12 is connected between the third resistor 43 and the fourth resistor 44. In addition, the output terminal of the high-speed operational amplifier 12 is connected to the buffer amplifier 13.

Meanwhile, the output terminal of the buffer amplifier 13 is connected to the external output unit 19. This buffer amplifier 13 operates by using the power from the first power supply 18a and the second power supply 18b.

Figure 5:
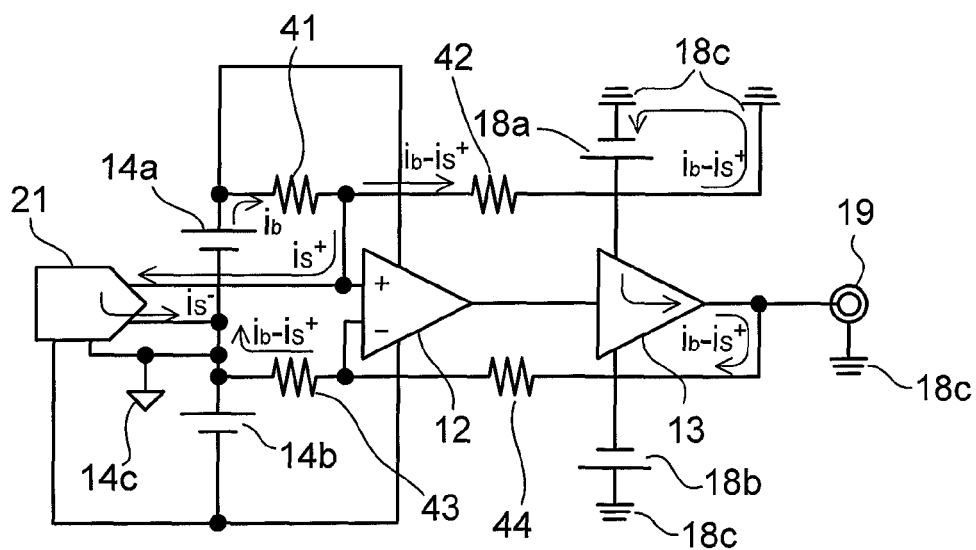
FIG. 5 is a circuit diagram showing an operation of the DA conversion device of FIG. 4.

Now, an operation of the DA conversion device 20 will be described. FIG. 5 is a circuit diagram for explaining the operation of the DA conversion device 20 shown in FIG. 4.

As shown in FIG. 5, a current $i_s^+$ having a direction indicated with an arrow is outputted from one of the output terminals of the DA converter 21 while a current $i_s^-$ having a direction indicated with another arrow is outputted from the other output terminal.

The current $i_s^+$ flows in from the first resistor 41 and subtracts an amount $i_s^+$ from a bias current $i_b$ which flows from the positive floating power supply 14a toward the grounding conductor 18c. The remaining current $(i_b - i_s^+)$ flows on the second resistor 42.

The current $(i_b - i_s^+)$ flows on a route from the grounding conductor 18c, then through the first power supply 18a, the buffer amplifier 13, the fourth resistor 44, the third resistor 43, and to the midpoint 14c as indicated with arrows in FIG. 5.

In the meantime, the current $i_s^+$ passes through the DA converter 21, then flows to the midpoint 14c as a current $i_s^-$, and merges with the current $(i_b - i_s^+)$ at the midpoint 14c.

Here, when $(i_b - i_s^+) = 0$ holds true, the current flowing on the second resistor 42 becomes 0 and no potential difference is generated at the second resistor 42. For this reason, the potential at the non-inverting input terminal of the high-speed operational amplifier 12 becomes 0 V which is the same potential as that of the grounding conductor 18c.

The output terminal of the high-speed operational amplifier 12 is connected to the non-inverting input terminal thereof via the buffer amplifier 13 and the fourth resistor 44. These constituents collectively form a closed loop. As a consequence, the voltage at the inverting input terminal of the high-speed operational amplifier 12 also becomes equal to 0 V which is the same potential as that of the non-inverting input terminal thereof.

In this state, no current flows on the third resistor 43 and the potential at the midpoint 14c between the floating power supplies becomes equal to 0 V which is the same as that of the grounding conductor 18c.

When current outputs $i_s^+$ and $i_s^-$ are changed from this state, voltage outputs corresponding to the amounts of the change in the currents are obtained.

Now, a change in the output voltage corresponding to the change in the outputted current $i_s^+$ from the DA converter 21 will be described below.

Here, the output current from the DA converter 21 is defined as $i_s^+$ and resistance values of the first to fourth resistors 41, 42, 43, and 44 are defined as $R_1$, $R_2$, $R_3$, and $R_4$, respectively. In the meantime, the potential at the non-inverting input terminal of the high-speed operational amplifier 12 is defined as $V_i^+$ and the potential at the inverting input terminal thereof is defined as $V_i^-$. The potential at the buffer amplifier 13 is defined as $V_o$. Further, the potential at the midpoint 14c between the floating power supplies is defined as $V_f$. Note that each potential cited above represents the potential based on the grounding conductor 18c.

In the meantime, the voltage (an electromotive force) of the first floating power supply 14a is defined as $V_2^+$ and the voltage (an electromotive force) of the second power supply 14b is defined as $V_2^-$. Meanwhile, the bias current flowing from the first floating power supply 14a to the first resistor 41 is defined as $i_b$.

The bias current $i_b$ is found in the first place. Focusing on the fact that the non-inverting input terminal and the inverting input terminal of the high-speed operational amplifier 12 have the same potential, the bias current $i_b$ can be expressed by the following Formula 1 using the resistance values of the first resistor 41 and the third resistor 43 as well as the output current $i_s^+$ from the DA converter 21.

$$i_b = \frac{V_2^+ - R_3(i_b - i_s^+)}{R_1} \tag{1}$$

The bias current $i_b$ is determined as in the following Formula 2 by solving Formula 1 for the value $i_b$.

$$i_b = \frac{V_2^+ + i_s^+ R_3}{R_1 + R_3} \tag{2}$$

Next, the potential $V_i^+$ at the non-inverting input terminal of the high-speed operational amplifier 12 is found.

The input of the high-speed operational amplifier 12 has high impedance, so that the entire current $(i_b - i_s^+)$ is deemed to flow on the second resistor 42. Accordingly, the potential $V_i^+$ at the non-inverting input terminal of the high-speed operational amplifier 12 is expressed by the following Formula 3.

$$V_i^+ = (i_b - i_s^+)R_2 \tag{3}$$

The potential $V_i^+$ at the non-inverting input terminal is found as in the following Formula 4 by assigning Formula 2 to Formula 3.

$$V_i^+ = \left(\frac{V_2^+ + i_s^+ R_3}{R_1 + R_3} - i_s^+\right)R_2 \tag{4}$$

Meanwhile, the potential $V_o$ at the output terminal of the buffer amplifier 13 is expressed by the following Formula 5.

$$V_o = R_4(i_b - i_s^+) + V_i^+ \tag{5}$$

The following Formula 6 expressing the potential $V_o$ at the output terminal of the buffer amplifier 13 is obtained by assigning Formula 2 to Formula 5 and performing adjustment as appropriate.

$$V_o = (R_4 - R_2)\left(\frac{V_2^+ - i_s^+ R_1}{R_1 + R_3}\right) \tag{6}$$

At this time, the potential $V_f$ at the midpoint 14c between the floating power supplies, which serves as an operation reference point of the high-speed operational amplifier 12, is expressed by the following Formula 7.

$$V_f = V_i^+ - R_3(i_b - i_s^+) \tag{7}$$

The following Formula 8 expressing the potential $V_f$ at the midpoint 14c is obtained by assigning Formula 2 and Formula 4 to Formula 7.

$$V_f = (R_2 - R_3)\left(\frac{V_2^+ - i_s^+ R_1}{R_1 + R_3}\right) \tag{8}$$

Comparison between Formula 6 which expresses the potential $V_o$ at the output terminal of the buffer amplifier 13 and Formula 8 which expresses the potential $V_f$ at the midpoint 14c proves that the potential $V_f$ at the midpoint 14c varies with the potential $V_o$ at the output terminal.

The following table shows calculation results of the potential $V_o$ at the external output unit 19 and the potential $V_f$ at the midpoint 14c on the premise that $R_1$ is set to 1 kΩ, $R_2$ is set to 4 kΩ, $R_3$ is set to 5Ω, $R_4$ is set to 20Ω, the voltage $V_2^+$ of the first floating power supply 14a is set to 5 V, and the voltage $V_2^-$ of the second floating power supply 14b is set to −5 V, respectively.

Upon the calculation, a gain of the high-speed operational amplifier 12 is set to 8 e buffer amplifier 13 is set to 0.99.

TABLE 1

| $i_s^+$ [mA] | $V_o$ [V] | $V_f$ [V] |
|---|---|---|
| 0 | 20 | 19.87562 |
| 2.5 | 10 | 9.93781 |
| 5 | 0 | 0 |
| 7.5 | −10 | −9.9378 |
| 10 | −20 | −19.87562 |

The above calculation results prove that the potential at the output terminal of the buffer amplifier 13 varies in a range from 20 [V] to −20 [V] with respect to the output current from the DA converter 21 in a range from 0 to 10 [mA]. The calculation results also prove that the potential $V_f$ at the midpoint 14c, based on which the high-speed operational amplifier 12 and the DA converter 21 operate, varies according to the potential $V_o$ at the output terminal of the buffer amplifier 13.

Accordingly, in the DA conversion device 20 of this example as well, the high-speed operational amplifier 12 operates normally even when the potential $V_o$ at the output terminal of the buffer amplifier 13 greatly exceeds the operating voltage of the high-speed operational amplifier 12. Hence, the settling time is reduced and the operating speed is increased.

Moreover, in the DA conversion device 20 of this example, positive and negative output voltages can be obtained from the output of the DA converter 21, which is unable to change the direction of the output current $i_s^+$, by appropriately setting the resistance values of the first to fourth resistors 41 to 44.

Example 3

Figure 6:
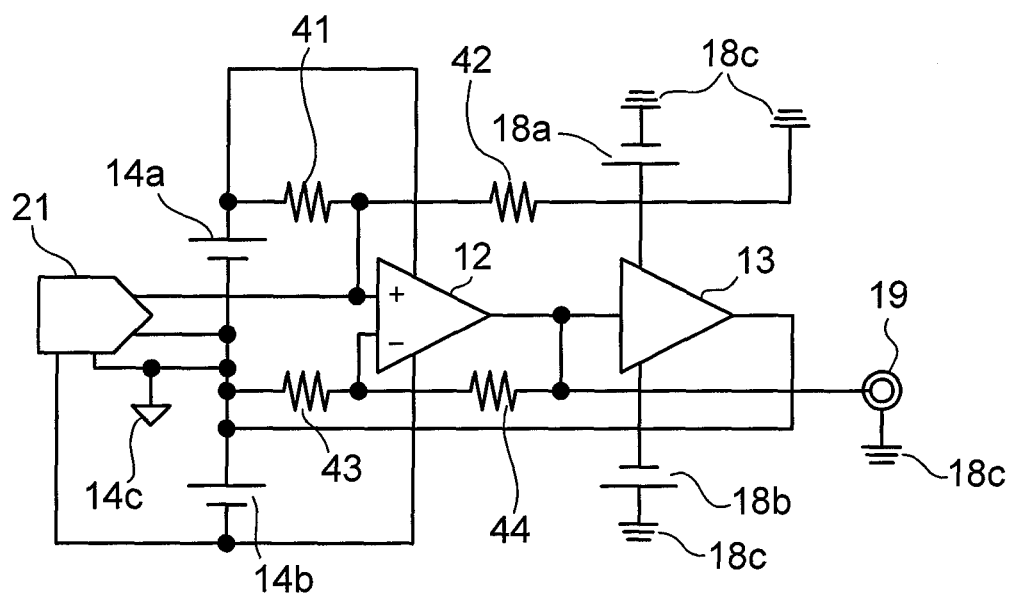
FIG. 6 is a circuit diagram of a DA conversion device according to Example 3.

FIG. 6 is a circuit diagram of a DA conversion device according to Example 3. In a DA conversion device 30 of FIG. 6, the same constituents as those in the DA conversion device 20 of FIG. 4 will be denoted by the same reference numerals and detailed description thereof will be omitted.

As shown in FIG. 6, the DA conversion device 30 of this example is similar to the DA conversion device 20 of FIG. 4 in that the device 30 includes the DA converter 21, the floating power supplies 14a and 14b, the first to fourth resistors 41, 42, 43, and 44, the high-speed operational amplifier 12, and the buffer amplifier 13.

Meanwhile, the non-inverting input terminal of the high-speed operational amplifier 12 is connected to the output terminal of the high-speed operational amplifier 12 via the fourth resistor 44, and the buffer amplifier 13 is therefore excluded from the feedback loop of the high-speed operational amplifier 12. In addition, the output terminal of the high-speed operational amplifier 12 is connected to the external output unit 19 of the DA conversion device 30.

Further, the output terminal of the buffer amplifier 13 is connected only to the midpoint 14c between the floating power supplies. Accordingly, the output from the buffer amplifier 13 is used solely for control of the potential at the midpoint 14c between the floating power supplies.

In the DA conversion device 30 described above as well, the potential at the midpoint 14c between the floating power supplies varies with the output from the buffer amplifier 13. Thus, the high-voltage output can be controlled by use of the high-speed operational amplifier 12, and the operating speed can be increased as a consequence.

Example 4

Figure 7:
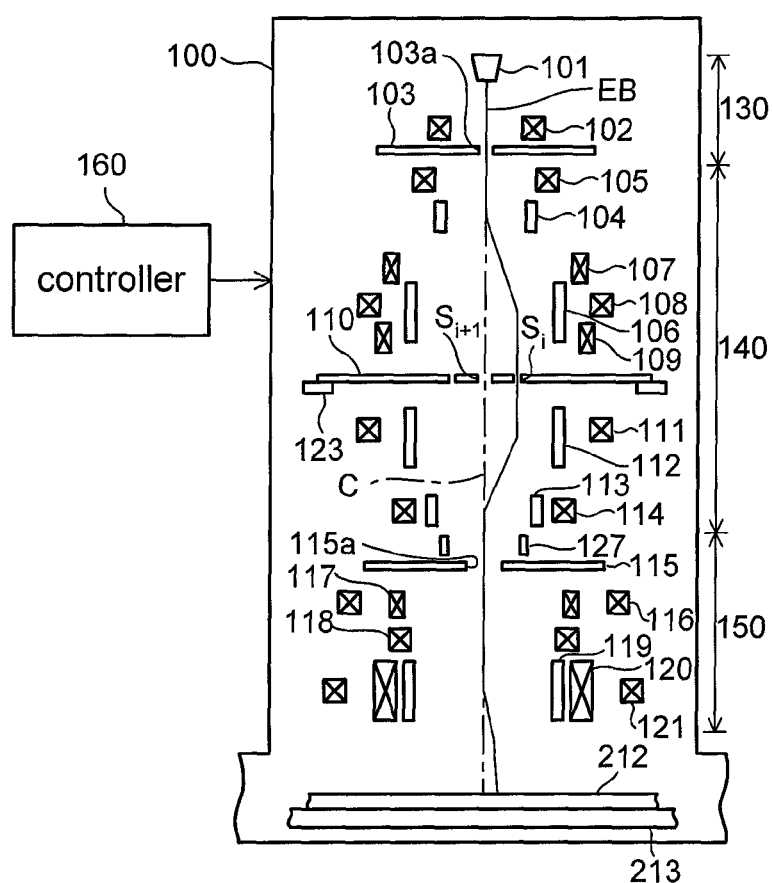
FIG. 7 is a block diagram of an electron beam exposure system according to Example 4.

FIG. 7 is a block diagram of an electron beam exposure system according to Example 4.

An electron beam exposure system 90 shown in FIG. 7 is broadly divided into an exposure section 100 and a control section 160 which controls the exposure section 100. Of the sections, the exposure section 100 includes an electron beam generation unit 130, a mask deflection unit 140, and a substrate deflection unit 150.

In the electron beam generation unit 130, an electron gun 101 generates an electron beam EB, and a first electron lens 102 converges this electron beam EB to form the electron beam EB with a predetermined current density. The converged electron beam EB further passes through a rectangular aperture 103a in a beam forming mask 103 and is thereby formed to have a rectangular section.

The electron beam EB thus generated by the electron beam generation unit 130 is focused on an exposure mask 110 with a second electron lens 105 of the mask deflection unit 140. Then, the electron beam EB is deflected by a first electrostatic deflector 104 and a second electrostatic deflector 106 into a shape of a specific pattern $S_i$ formed on the exposure mask 110. As the electron beam EB passes through the exposure mask 110, the sectional shape of the electron beam EB is formed into the shape of the pattern $S_i$.

The electron beam EB having passed through the exposure mask 110 is returned to an optical axis C by a third electrostatic deflector 112 and a fourth electrostatic deflector 113, and is then downsized by a fifth electromagnetic lens 114.

Deflection aberrations of the electron beam EB caused by the electrostatic deflectors 104, 106, 112, and 113 of the mask deflection unit 140 are corrected by a first correction coil 107 and a second correction coil 109.

Thereafter, the electron beam EB passes through an aperture 115a in a masking shield 115 provided in the substrate deflection unit 150 and is deflected to a predetermined position on a wafer 212 by a fifth electrostatic deflector 119 and an electromagnetic deflector 120. Then, the electron beam EB is projected onto a surface of the wafer 212 through a first projection electromagnetic lens 116 and a second projection electromagnetic lens 121.

A third correction coil 117 and a fourth correction coil 118 correct deflection aberrations of the electron beam EB caused by the deflectors 119 and 120 of the substrate deflection unit 150.

With the above-described electron optical system, an image of the pattern $S_i$ on the exposure mask 110 is transferred onto the wafer 212 at a predetermined reduction ratio such as 1/20.

In the meantime, the control section 160 controls the units of the electron optical system included in the exposure section 100.

The control section 160 includes any of the DA conversion device 10 (see FIG. 2), the DA conversion device 20 (see FIG. 4), and the DA conversion device 30 (see FIG. 6) as a circuit for generating voltages to be applied to the first to fifth electrostatic deflectors 104, 106, 112, 113, and 119.

In this way, the electron beam exposure system 90 of this example can apply voltages to the electrostatic deflectors by using the DA conversion device which is excellent in terms of the operating speed. Accordingly, settling time for stabilization of the voltages on the electrostatic deflectors is substantially reduced.

As a consequence, the electron beam exposure system 90 can perform deflection of the electron beam more promptly and thereby improve throughput.

The invention claimed is:

1. A digital-to-analog (DA) conversion device comprising:
a current output type DA converter;
an operational amplifier including a non-inverting input terminal connected to the DA converter and an inverting input terminal connected to an external output unit to output an output signal to outside, and being configured to generate a voltage at the external output unit, the voltage corresponding to an output current from the DA converter;
a buffer amplifier connected to an output terminal of the operational amplifier;
power supply devices configured to respectively supply positive and negative power supply voltages to the buffer amplifier; and
floating power supplies configured to respectively supply positive and negative power supply voltages directly to the DA converter and the operational amplifier, wherein a voltage midpoint between the positive and negative power supplies is connected to an output terminal of the buffer amplifier, and
wherein an absolute value of the power supply voltages from the power supply devices to the buffer amplifier is greater than an absolute value of the power supply voltages from the floating power supplies.

2. The DA conversion device according to claim 1, further comprising
a resistor connected between a grounding conductor for the power supply devices for the buffer amplifier and the non-inverting input terminal of the operational amplifier.

3. The DA conversion device according to claim 1, further comprising:
a first resistor and a second resistor connected in series between a grounding conductor for the power supply devices and one of the floating power supplies configured to output the positive voltage; and
a third resistor and a fourth resistor connected in series between the output terminal of the buffer amplifier and the voltage midpoint, wherein
the non-inverting input terminal of the operational amplifier is connected to an output terminal of the DA converter and is connected between the first resistor and the second resistor, and the inverting input terminal of the operational amplifier is connected between the third resistor and the fourth resistor.

4. The DA conversion device according to claim 3, wherein the output terminal of the buffer amplifier is connected to the external output unit.

5. The DA conversion device according to claim 3, wherein the output terminal of the operational amplifier is connected to the external output unit.

6. An electron beam exposure system comprising:
an electron gun configured to emit an electron beam;
an electrostatic deflector configured to deflect the electron beam; and
a control section configured to control a voltage to be applied to the electrostatic deflector, wherein the control section includes a digital-to-analog (DA) conversion device having:
a current output type DA converter;
an operational amplifier having a non-inverting input terminal connected to the DA converter and an inverting input terminal connected to an external output unit to output an output signal to outside, and being configured to generate a voltage at the external output unit, the voltage corresponding to an output current from the DA converter;
a buffer amplifier connected to an output terminal of the operational amplifier;
power supply devices configured to respectively supply positive and negative power supply voltages to the buffer amplifier; and
floating power supplies configured to respectively supply positive and negative power supply voltages directly to the DA converter and the operational amplifier,
wherein a voltage midpoint between the positive and negative power supplies is connected to an output terminal of the buffer amplifier, and
wherein an absolute value of the power supply voltages from the power supply devices to the buffer amplifier is greater than an absolute value of the power supply voltages from the floating power supplies; and
wherein the external output unit of the DA conversion device is connected to the electrostatic deflector.

* * * * *

UNITED STATES PATENT AND TRADEMARK OFFICE
CERTIFICATE OF CORRECTION

| | |
|---|---|
| PATENT NO. | : 8,618,970 B2 |
| APPLICATION NO. | : 13/682311 |
| DATED | : December 31, 2013 |
| INVENTOR(S) | : Sato et al. |

It is certified that error appears in the above-identified patent and that said Letters Patent is hereby corrected as shown below:

On the Title Page:

Please change:

(73) Assignees: Advantest Corp., Tokyo (JP); Hitachi Information Teleommunication Engineering, Ltd., Kanagawa (JP)

to

(73) Assignees: Advantest Corp., Tokyo (JP); Hitachi Information Telecommunication Engineering, Ltd., Kanagawa (JP)

Signed and Sealed this
Eighth Day of March, 2016

Michelle K. Lee
*Director of the United States Patent and Trademark Office*